US011990175B2

(12) United States Patent
Sato

(10) Patent No.: US 11,990,175 B2
(45) Date of Patent: May 21, 2024

(54) APPARATUSES AND METHODS FOR CONTROLLING WORD LINE DISCHARGE

(71) Applicant: Micron Technology, Inc., Boise, ID (US)

(72) Inventor: Toshiyuki Sato, Asaka (JP)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 17/711,858

(22) Filed: Apr. 1, 2022

(65) Prior Publication Data

US 2023/0317139 A1     Oct. 5, 2023

(51) Int. Cl.
G11C 11/00       (2006.01)
G11C 11/4076     (2006.01)
G11C 11/408      (2006.01)

(52) U.S. Cl.
CPC ...... *G11C 11/4085* (2013.01); *G11C 11/4076* (2013.01); *G11C 11/4087* (2013.01)

(58) Field of Classification Search
CPC ......... G11C 11/4085; G11C 8/14; G11C 8/08; G11C 11/4087; G11C 8/10; G11C 11/4094; G11C 2029/1202; G11C 29/02; G11C 7/02; G11C 11/4076; G11C 11/4097; G11C 5/025; G11C 8/18; G11C 11/5678; G11C 13/0004; G11C 13/003; G11C 13/0061; G11C 13/0064; G11C 13/0069; G11C 2013/009; G11C 2013/0092; G11C 2213/74; G11C 2213/79
USPC .... 365/163, 230.06, 185.23, 189.11, 189.16, 365/230.05, 233.5
See application file for complete search history.

(56) References Cited

U.S. PATENT DOCUMENTS 5,274,592 A    12/1993   Sueoka et al.
5,524,095 A     6/1996   Someya et al.
5,587,960 A    12/1996   Ferris
(Continued)

FOREIGN PATENT DOCUMENTS

CN    1106550 A    8/1995
CN    1171632 A    1/1998
(Continued)

OTHER PUBLICATIONS

International Application No. PCT/US20/26423, titled "Apparatuses and Methods for Controlling Word Line Discharge", dated Apr. 2, 2020.
(Continued)

*Primary Examiner* — Thong Q Le
(74) *Attorney, Agent, or Firm* — Dorsey & Whitney LLP

(57) ABSTRACT

An apparatus includes a subword driver configured to drive a subword line, wherein the subword driver includes a transistor coupled to the subword line, a word driver control circuit configured to provide a first control signal and a second control signal, and a word driver configured to receive the first and second control signals, and based on the first control signal provide a driving signal including a plurality of reset pulses to the transistor of the subword driver to activate the transistor a corresponding plurality of times to discharge the subword line, and further provide the driving signal including a transition following the plurality of reset pulses to activate the transistor to further discharge the subword line.

19 Claims, 8 Drawing Sheets

(56) References Cited

U.S. PATENT DOCUMENTS

| | | | |
|---|---|---|---|
| 5,886,942 A | 3/1999 | Akita | |
| 6,026,047 A | 2/2000 | Ryu et al. | |
| 6,028,813 A | 2/2000 | Choi | |
| 6,178,122 B1 | 1/2001 | Tomishima et al. | |
| 6,337,832 B1 | 1/2002 | Ooishi et al. | |
| 6,421,295 B1 | 7/2002 | Mao et al. | |
| 6,507,532 B1 | 1/2003 | Fujino et al. | |
| 6,628,564 B1 | 9/2003 | Takita et al. | |
| 7,251,160 B2 | 7/2007 | Li et al. | |
| 7,289,367 B2 * | 10/2007 | Sugawara | G11C 8/18 365/189.11 |
| 7,492,640 B2 | 2/2009 | Mokhlesi | |
| 7,529,131 B2 | 5/2009 | Iwai et al. | |
| 8,358,535 B2 | 1/2013 | Chae et al. | |
| 8,395,936 B2 | 3/2013 | Li et al. | |
| 8,804,446 B2 | 8/2014 | Okahiro | |
| 8,891,325 B2 | 11/2014 | Choi et al. | |
| 8,953,407 B2 | 2/2015 | Yun et al. | |
| 9,111,633 B2 | 8/2015 | Kim | |
| 9,373,378 B1 | 6/2016 | Chen | |
| 9,412,447 B1 | 8/2016 | Bertin et al. | |
| 9,418,711 B2 | 8/2016 | Ohgami | |
| 9,552,866 B2 | 1/2017 | Mochida et al. | |
| 9,653,131 B1 | 5/2017 | Yamanaka et al. | |
| 9,824,746 B1 | 11/2017 | Lee | |
| 9,922,726 B2 | 3/2018 | Choi | |
| 10,008,256 B1 | 6/2018 | Kim | |
| 10,014,063 B2 | 7/2018 | Tseng et al. | |
| 10,347,321 B1 | 7/2019 | Yamanaka et al. | |
| 10,490,256 B2 | 11/2019 | Jeong | |
| 10,529,400 B1 | 1/2020 | Mahatme et al. | |
| 10,553,297 B2 | 2/2020 | Sanasi et al. | |
| 10,614,893 B2 | 4/2020 | Miyazaki | |
| 10,636,469 B2 | 4/2020 | El-mansouri et al. | |
| 10,650,882 B2 | 5/2020 | Lin et al. | |
| 10,665,271 B2 | 5/2020 | Takeda et al. | |
| 10,672,443 B2 | 6/2020 | Gupta et al. | |
| 10,685,709 B2 | 6/2020 | Tanaka et al. | |
| 10,847,207 B2 | 11/2020 | Yamamoto et al. | |
| 10,854,272 B1 | 12/2020 | Sato et al. | |
| 10,854,273 B1 | 12/2020 | Sato | |
| 10,854,274 B1 | 12/2020 | Grenzebach et al. | |
| 10,910,027 B2 | 2/2021 | Suzuki | |
| 10,910,075 B2 | 2/2021 | Yang et al. | |
| 10,937,476 B2 | 3/2021 | Sato et al. | |
| 11,176,977 B2 | 11/2021 | Sato et al. | |
| 11,205,470 B2 | 12/2021 | Park et al. | |
| 11,257,532 B2 | 2/2022 | Suzuki | |
| 2002/0001215 A1 | 1/2002 | Fujisawa et al. | |
| 2002/0012284 A1 | 1/2002 | Mochida | |
| 2002/0051377 A1 | 5/2002 | Choi et al. | |
| 2002/0080677 A1 | 6/2002 | Watanabe et al. | |
| 2003/0095438 A1 | 5/2003 | Hosogane | |
| 2004/0004899 A1 | 1/2004 | Choi | |
| 2004/0052146 A1 | 3/2004 | Sim | |
| 2004/0156260 A1 | 8/2004 | Lee | |
| 2004/0196719 A1 | 10/2004 | Aritomi et al. | |
| 2005/0117411 A1 | 6/2005 | Koshikawa et al. | |
| 2005/0128858 A1 | 6/2005 | Lee et al. | |
| 2005/0226086 A1 | 10/2005 | Sugawara | |
| 2005/0254299 A1 | 11/2005 | Tanuma et al. | |
| 2006/0158953 A1 | 7/2006 | Takahashi | |
| 2006/0176758 A1 | 8/2006 | Chun | |
| 2007/0008807 A1 | 1/2007 | Jeong | |
| 2007/0030741 A1 | 2/2007 | Nii et al. | |
| 2007/0223283 A1 | 9/2007 | Matsubara | |
| 2008/0031060 A1 | 2/2008 | Choi et al. | |
| 2008/0080229 A1 | 4/2008 | Cho | |
| 2008/0123463 A1 | 5/2008 | Matsubara | |
| 2009/0161418 A1 | 6/2009 | Yoon | |
| 2009/0201753 A1 | 8/2009 | Riho et al. | |
| 2010/0046313 A1 | 2/2010 | Lee et al. | |
| 2010/0110808 A1 | 5/2010 | Riho | |
| 2010/0142306 A1 | 6/2010 | Nakamura et al. | |
| 2010/0149900 A1 | 6/2010 | Kitayama | |
| 2010/0157716 A1 | 6/2010 | Lee | |
| 2011/0149673 A1 | 6/2011 | Sim | |
| 2011/0199837 A1 | 8/2011 | Reohr et al. | |
| 2011/0228624 A1 | 9/2011 | Kim et al. | |
| 2012/0081957 A1 | 4/2012 | Kim et al. | |
| 2012/0120751 A1 | 5/2012 | Okahiro | |
| 2012/0147686 A1 | 6/2012 | Takayama et al. | |
| 2012/0218843 A1 | 8/2012 | Yun et al. | |
| 2012/0257437 A1 | 10/2012 | Seko et al. | |
| 2012/0287699 A1 | 11/2012 | Yun et al. | |
| 2012/0327108 A1 | 12/2012 | Kato et al. | |
| 2013/0135915 A1 | 5/2013 | Kim | |
| 2013/0215697 A1 | 8/2013 | Choi et al. | |
| 2013/0329495 A1 | 12/2013 | Shiino et al. | |
| 2014/0006703 A1 | 1/2014 | Bains et al. | |
| 2014/0369149 A1 | 12/2014 | Park | |
| 2015/0098260 A1 | 4/2015 | Ohgami | |
| 2015/0227738 A1 | 8/2015 | Katoh | |
| 2015/0255146 A1 | 9/2015 | Mochida | |
| 2015/0364174 A1 | 12/2015 | Ahn et al. | |
| 2016/0095178 A1 | 3/2016 | Kuang et al. | |
| 2016/0180948 A1 | 6/2016 | Tanabe | |
| 2017/0075595 A1 | 3/2017 | Maejima | |
| 2017/0103798 A1 | 4/2017 | Mochida | |
| 2017/0178751 A1 | 6/2017 | Choi | |
| 2017/0271021 A1 | 9/2017 | Futatsuyama et al. | |
| 2017/0278579 A1 | 9/2017 | Lee et al. | |
| 2018/0040362 A1 | 2/2018 | Kwak et al. | |
| 2018/0074896 A1 | 3/2018 | Takada et al. | |
| 2018/0166119 A1 | 6/2018 | Jeong | |
| 2018/0277182 A1 | 9/2018 | Inaba | |
| 2019/0013055 A1 | 1/2019 | Ohgami | |
| 2019/0035466 A1 | 1/2019 | Kim et al. | |
| 2019/0088333 A1 | 3/2019 | Shirakawa et al. | |
| 2019/0180812 A1 | 6/2019 | Sung et al. | |
| 2019/0189186 A1 | 6/2019 | Won et al. | |
| 2019/0214293 A1 | 7/2019 | Kim et al. | |
| 2019/0252385 A1 | 8/2019 | Yudanov et al. | |
| 2019/0325934 A1 | 10/2019 | Matsubara | |
| 2019/0385649 A1 | 12/2019 | Kawamura | |
| 2020/0027489 A1 | 1/2020 | Choi et al. | |
| 2020/0075110 A1 | 3/2020 | Suzuki et al. | |
| 2020/0105352 A1 | 4/2020 | Tanzawa | |
| 2020/0111517 A1 | 4/2020 | Seo et al. | |
| 2020/0143890 A1 | 5/2020 | Lee | |
| 2020/0152249 A1 | 5/2020 | Kawamura | |
| 2020/0185024 A1 | 6/2020 | Rehmeyer et al. | |
| 2020/0294571 A1 | 9/2020 | Shin | |
| 2020/0295021 A1 | 9/2020 | Maejima | |
| 2020/0321045 A1 | 10/2020 | Yamamoto et al. | |
| 2020/0327916 A1 | 10/2020 | Suzuki | |
| 2020/0402557 A1 | 12/2020 | Sato et al. | |
| 2020/0402565 A1 | 12/2020 | Sato et al. | |
| 2020/0402566 A1 | 12/2020 | Sato | |
| 2021/0012819 A1 | 1/2021 | Suzuki | |
| 2021/0183422 A1 | 6/2021 | Sato et al. | |
| 2021/0327490 A1 | 10/2021 | Park et al. | |

FOREIGN PATENT DOCUMENTS

| | | |
|---|---|---|
| CN | 1245338 A | 2/2000 |
| CN | 1655280 A | 8/2005 |
| CN | 1681044 A | 10/2005 |
| CN | 1811983 A | 8/2006 |
| CN | 1848301 A | 10/2006 |
| CN | 1889188 A | 1/2007 |
| CN | 101002277 A | 7/2007 |
| CN | 101047022 A | 10/2007 |
| CN | 102760482 A | 10/2012 |
| CN | 104332171 A | 2/2015 |
| CN | 105825883 A | 8/2016 |
| CN | 107545917 A | 1/2018 |
| CN | 109196585 A | 1/2019 |
| CN | 109308921 A | 2/2019 |
| CN | 109390008 A | 2/2019 |
| CN | 109390009 A | 2/2019 |
| EP | 0591009 A2 | 4/1994 |
| JP | H08227597 A | 9/1996 |
| JP | H0963295 A | 3/1997 |

(56) References Cited

FOREIGN PATENT DOCUMENTS

| | | |
|---|---|---|
| JP | 2008022349 A | 1/2008 |
| JP | 2016015185 A | 1/2016 |
| JP | 2016062625 A | 4/2016 |
| KR | 100648861 B1 | 11/2006 |
| KR | 20090077586 A | 7/2009 |
| KR | 20100029484 A | 3/2010 |
| KR | 20140136766 A | 12/2014 |
| KR | 20170120319 A | 10/2017 |
| KR | 20190006346 A | 1/2019 |
| WO | 2020210113 A1 | 10/2020 |

OTHER PUBLICATIONS

U.S. Appl. No. 16/584,746 titled "Apparatuses and Methods for Dynamic Timing of Row Pull Down Operations" filed Sep. 26, 2019.

* cited by examiner

APPARATUSES AND METHODS FOR CONTROLLING WORD LINE DISCHARGE

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FXL) selected by a second portion of the row address.

A memory cell array included in a semiconductor memory device such as the DRAM may be divided into a plurality of memory mats to reduce the wiring capacitance of the subword lines and the bit lines. Each memory mat includes respective main word lines so that when the main word line is selected using the first portion of the row address, the memory mat to be selected is also determined at the same time.

The driving process of the subword lines is carried out by subword drivers, and when a subword line is driven to a high voltage, the memory cell is coupled to the corresponding bit line. On the other hand, during a period in which the subword line is driven to a low voltage, the memory cell and the bit line are kept in a cut-off state. In driving subword lines to the high voltage, relatively high voltages are provided to the subword drivers of a memory mat. In contrast, in driving the subword line to a low voltage, relatively low voltages are provided to the subword drivers of the memory mat.

Repeated access to a particular subword line may cause an increased rate of data degradation in nearby subword lines. To reduce the effect of repeated access to a subword line, discharge of subword lines have been controlled. For example, rates of discharge and/or voltages to which the subword lines discharge have been controlled by resetting a word driving line such that subword lines are discharged gradually. However, such gradual discharge may not meet stringent memory operation requirements, such as a minimum time to precharge (e.g., 15 ns) and/or cause variations in discharging rates along a length of the subword lines.

Therefore, there is a need for apparatuses for and methods of discharging subword lines that may mitigate the effects of repeated word line access while meeting the memory operation requirements and reducing variation in discharging rates of subword lines.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A semiconductor memory device may include hierarchically structured main word lines and subword lines. The main word line is a word line positioned at an upper hierarchy, and is selected by a first portion of a row address. The subword line (SWL) is a word line positioned at a lower hierarchy and is selected based on a corresponding main word line (MWL) and a word driver line (FXL), which is selected by a second portion of the row address. The MWL may be driven by main word drivers (MWD) and the word driver line FXL may be driven by word drivers (FXD). Both the MWL and FXL must be driven to active states to select the desired subword line SWL in the memory device.

As described herein, the discharge of a subword line may be controlled. For example, the rate of discharge and/or the voltage to which the subword line discharges may be controlled. In some embodiments, the discharge of the subword line may be controlled by repeating the resent of a first word driver line signal and/or a second word driver line signal. The discharging rates of the subword lines may be increased and variation in the discharging rates of subword lines reduced.

Figure 1:
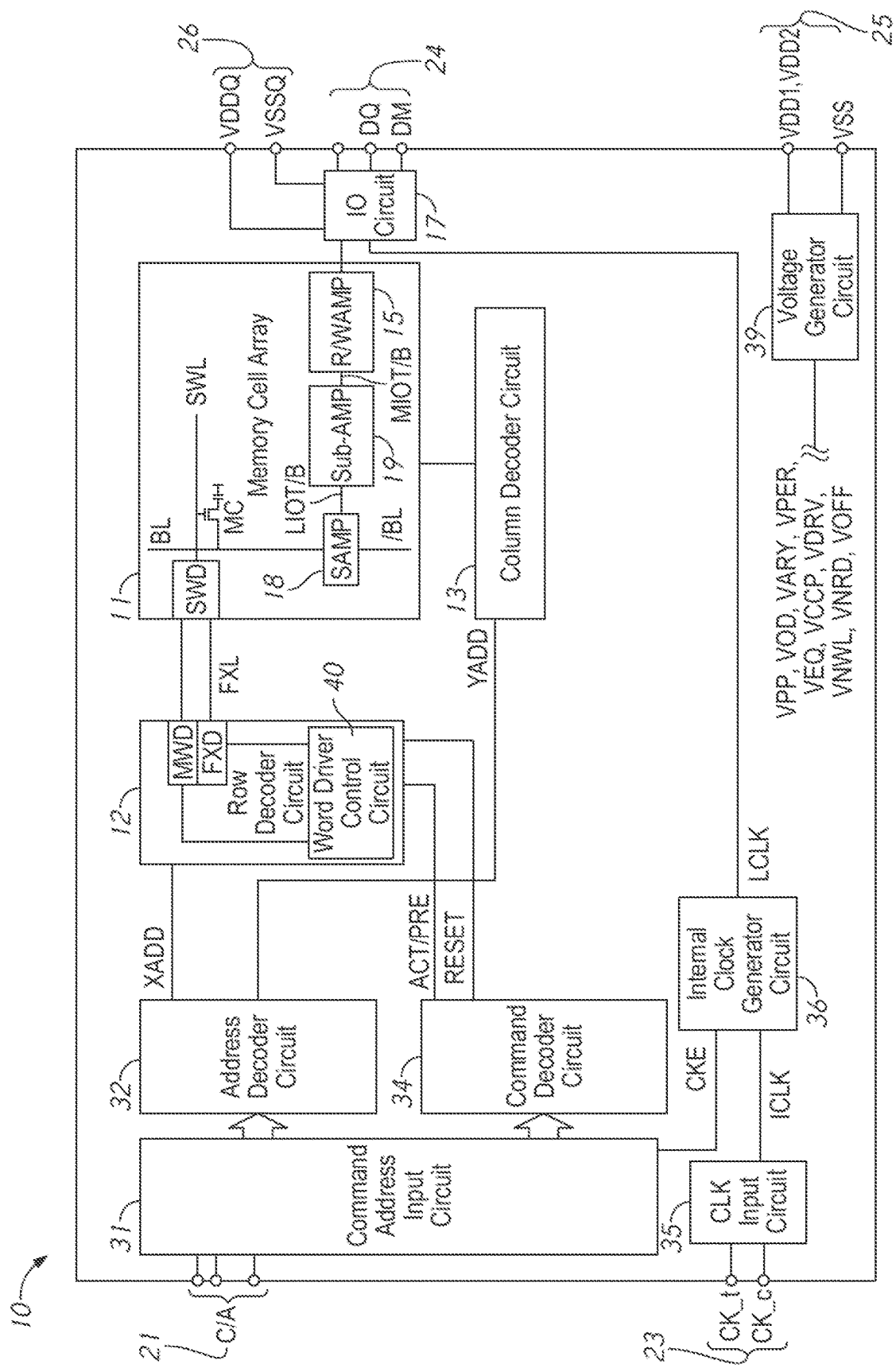
FIG. 1 is a block diagram of a semiconductor device according to an embodiment of the disclosure.

FIG. 1 is a block diagram of a semiconductor device 10 according to an embodiment of the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells MC disposed at the intersections. The SWL may be driven by subword drivers SWD. For clarity, only one SWL. SWD, BL, and MC are shown in FIG. 1. A plurality of main word lines MWL and word driver lines FXL are coupled between a row decoder circuit 12 and the SWD. The selection of a main word line MWL and a word driver line FXL is carried out by the row decoder circuit 12. Specifically, the row decoder circuit 12 may control main word drivers (MWD) and word drivers (FXD) to select the main word lines MWL and word driver lines FXL. For clarity, only one MWD and FXD are shown. The selection of the bit line BL is carried out by a column decoder circuit 13. Sense amplifiers 18 are coupled to corresponding bit lines BL and coupled to local I/O line pairs LIOT/B. Local IO line pairs LIOT/B are coupled to main 10 line pairs MIOT/B via transfer gates 19 which function as switches to read/write amplifiers 15.

Turning to the explanation of a plurality of external terminals included in the semiconductor device 10, the plurality of external terminals includes command/address terminals 21, clock terminals 23, data terminals 24, and power supply terminals 25 and 26.

The command/address terminals 21 are provided with command and address signals. The address signals provided to the command/address terminals 21 are transferred via a command/address input circuit 31 to an address decoder circuit 32. The address decoder circuit 32 receives the address signal ADD and supplies a decoded row address signal XADD to the row decoder circuit 12, and a decoded column address signal YADD to the column decoder circuit 13. The command signals provided to the command/address terminals 21 are input to a command decoder circuit 34 via the command/address input circuit 31. The command decoder circuit 34 decodes the command signal COM to provide various internal command signals. For example, the command decoder circuit 34 may activate an activation signal ACT in response to an activation command and/or activate a precharge signal PRE in response to a precharge command. The command decoder circuit 34 may also activate a reset signal Reset as part of a precharge operation. For example, the internal commands may include a row command signal to select a word line and a column command signal, such as a read command or a write command, to select a bit line.

When a row activation command is issued and a row address is timely provided with the activation command, and a column address is timely provided with a read command, read data DQ is read from a memory cell MC in the memory cell array 11 designated by these row address and column address. More specifically, the row decoder circuit 12 selects a main word line MWL, word driver line FXL, and subword line SWL indicated by the row address RA indicated by XADD so that the associated memory cell MC is subsequently coupled to the bit line BL. The read data DQ is output externally from the data terminals 24 via a read/write amplifier 15 and an input/output circuit 17. Similarly, when the row activation command is issued and a row address are timely provided with the activation command, and a column address is timely provided with a write command, the input/output circuit 17 may receive write data DQ and a data mask DM at the data terminals 24. The write data DQ is provided via the input/output circuit 17 and the read/write amplifier 15 to the memory cell array 11 and written in the memory cell MC designated by the row address and the column address.

The row decoder circuit 12 may include a word driver control circuit 40 in some embodiments. The word driver control circuit 40 may receive an activation signal ACT from the command decoder circuit 34. In some embodiments, the word driver control circuit 40 may receive additional signals. The word driver control circuit 40 may provide control signals to one or more word drivers included in the row decoder circuit 12, such as the main word driver MWD and/or word driver FXD.

The clock terminals 23 are provided with external clock signals CK_t and CK_c, respectively. These external clock signals CK and /CK are complementary to each other and are provided to a clock input circuit 35. The clock input circuit 35 receives the external clock signals CK and /CK and provides an internal clock signal ICLK. The internal clock signal ICLK is provided to an internal clock generator 36 and thus a phase controlled internal clock signal LCLK is provided based on the received internal clock signal ICLK and a clock enable signal CKE from the command/address input circuit 31. Although not limited thereto, a DLL circuit can be used as the internal clock generator 36. The phase controlled internal clock signal LCLK is provided to the input/output circuit 17 and is used as a timing signal for determining an output timing of the read data DQ.

The power supply terminals 25 are provided with power supply voltages VDD1. VDD2, and VSS. These power supply voltages VDD1, VDD2, and VSS are provided to an internal voltage generator circuit 39. The internal voltage generator circuit 39 provides various internal voltages VPP, VOD, VARY, VPERI, VEQ, VCCP, VDRV, VNRD, VNWL, and VOFF.

The internal voltages VCCP, VDRV, VNRD and VOFF are voltages which may be mainly used in the row decoder circuit 12 in some embodiments. VSS may also be used by row decoder circuit 12. For example, VSS may be used as a low voltage and VCCP may be used as a high voltage in some embodiments. VNRD may be a negative voltage in some embodiments. In some embodiments VOFF may be a low voltage, but a voltage greater than VSS. Although the detailed description thereof will be given later, the row decoder circuit 12 drives the main word line MWL and subword line SWL, selected based upon the address signal ADD, to a VCCP level corresponding to a high voltage (e.g., 3.1 V) so that a cell transistor of the memory cell MC is turned on.

The internal voltage VARY and VEQ is a voltage to be used by the sense amplifier 18, transfer gates 19 and/or read/write amplifiers 15. When the sense amplifier 18 is activated, the read data DQ read out is amplified by driving one of the paired bit lines to a VARY level with the other one being driven to a VSS level. The internal voltage VPERI is used as a power supply voltage for most of the peripheral circuits, such as the command/address input circuit 31. By using the internal voltage VPERI having a lower voltage than the external voltage VDD as the power supply voltage of these peripheral circuits, it may be possible to reduce power consumption of the semiconductor device 10.

The power supply terminals 26 are provided with power supply voltages VDDQ and VSSQ. These power supply voltages VDDQ and VSSQ are provided to the input/output circuit 17. The power supply voltages VDDQ and VSSQ may be the same voltages as the power supply voltages VDD2 and VSS that are provided to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
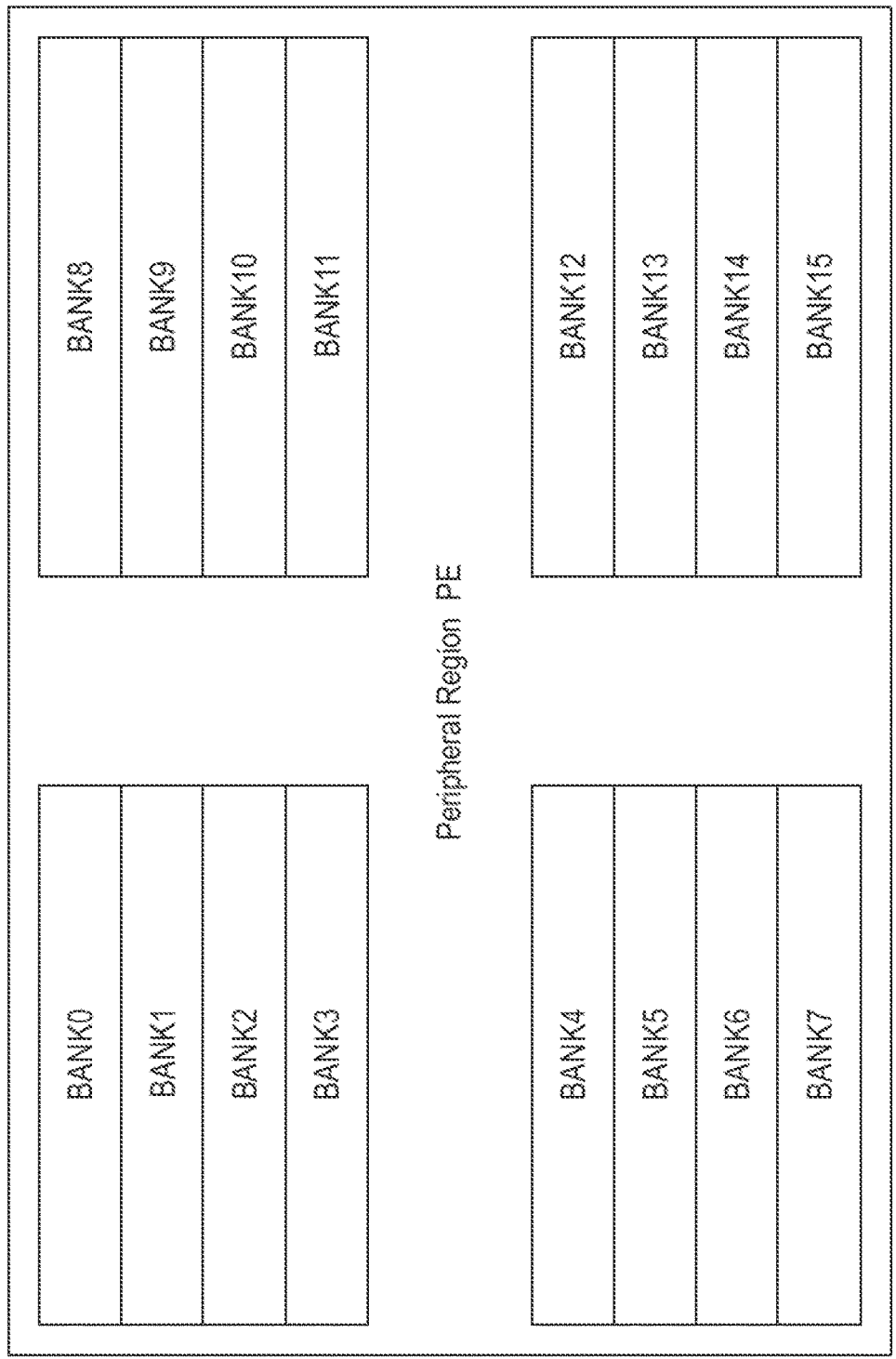
FIG. 2 is a diagram for a layout of a semiconductor device according to an embodiment of the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 shown in FIG. 1.

The memory cell array 200 of the example shown in FIG. 2 is divided into sixteen banks BK0 to BK15. A row decoder circuit (e.g., row decoder circuit 12 of FIG. 1; not shown in FIG. 2) may be disposed between adjacent banks and/or in the peripheral circuit region PE. In the peripheral circuit region PE, various peripheral circuits and external terminals may be disposed (not shown in FIG. 2).

Figure 3:
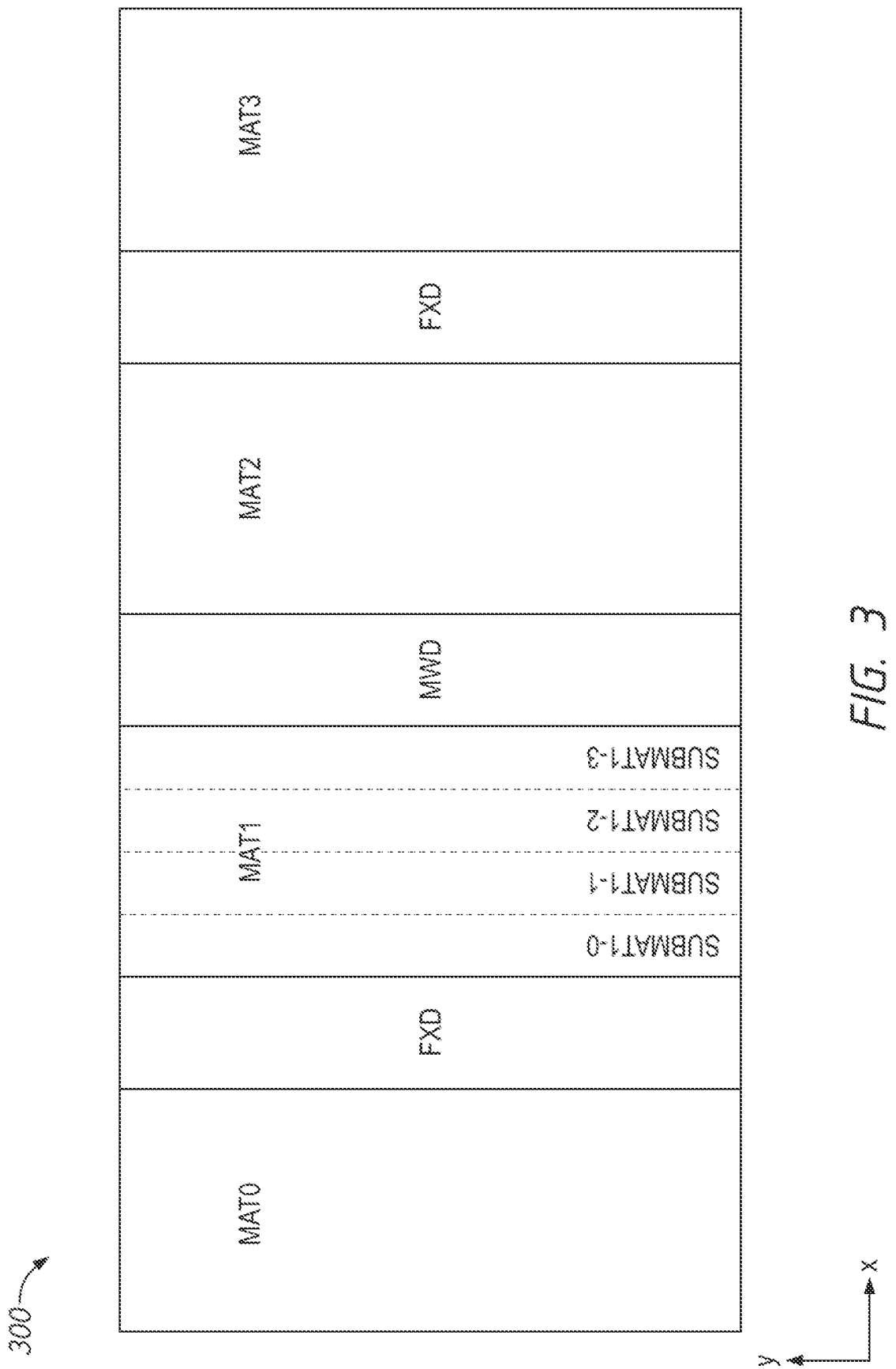
FIG. 3 is a diagram for a configuration of a bank of a memory cell array of a semiconductor device according to an embodiment of the disclosure.

FIG. 3 is a diagram for an example configuration of a bank 300 of a memory cell array according to an embodiment of the disclosure. The banks BK0 to BK15 of FIG. 2 may each include the configuration of the bank 300 of FIG. 3 in some embodiments of the disclosure. In some embodiments, the bank 300 may be included in memory cell array 11 of the semiconductor device 10 shown in FIG. 1.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions SUBMAT1-0-3. While the example shown in FIG. 3 includes four sub-regions, memory mat regions MAT0-3 may include more or fewer sub regions in other examples. Each sub-region SUBMAT1-0-3 may include a plurality of memory mats (e.g., 32, 64, 128) aligned in the Y-direction. In some embodiments, the plurality of memory mats in a sub-region may be further sub-divided into sets. For example, SUBMAT1-0 may include 64 memory mats and the memory mats may be organized into eight sets of eight. For clarity, the individual memory mats are not shown in FIG. 3. The memory mats of each sub-region SUBMAT1-0-3 may be associated with a corresponding 10 (e.g., DQ pad) in some embodiments.

The subword driver operations are controlled by a row decoder circuit (not shown in FIG. 3), for example, the row decoder circuit 12 of FIG. 1. When a row address RA is input thereto, the row decoder selects a subword line by activating an appropriate main word driver (MWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWD, each configured to activate a corresponding main word line (MWL). Continuing this example, each word driver FXD block may include eight word drivers FXDs, each configured to activate a corresponding word driver line (FXL).

Figure 4:
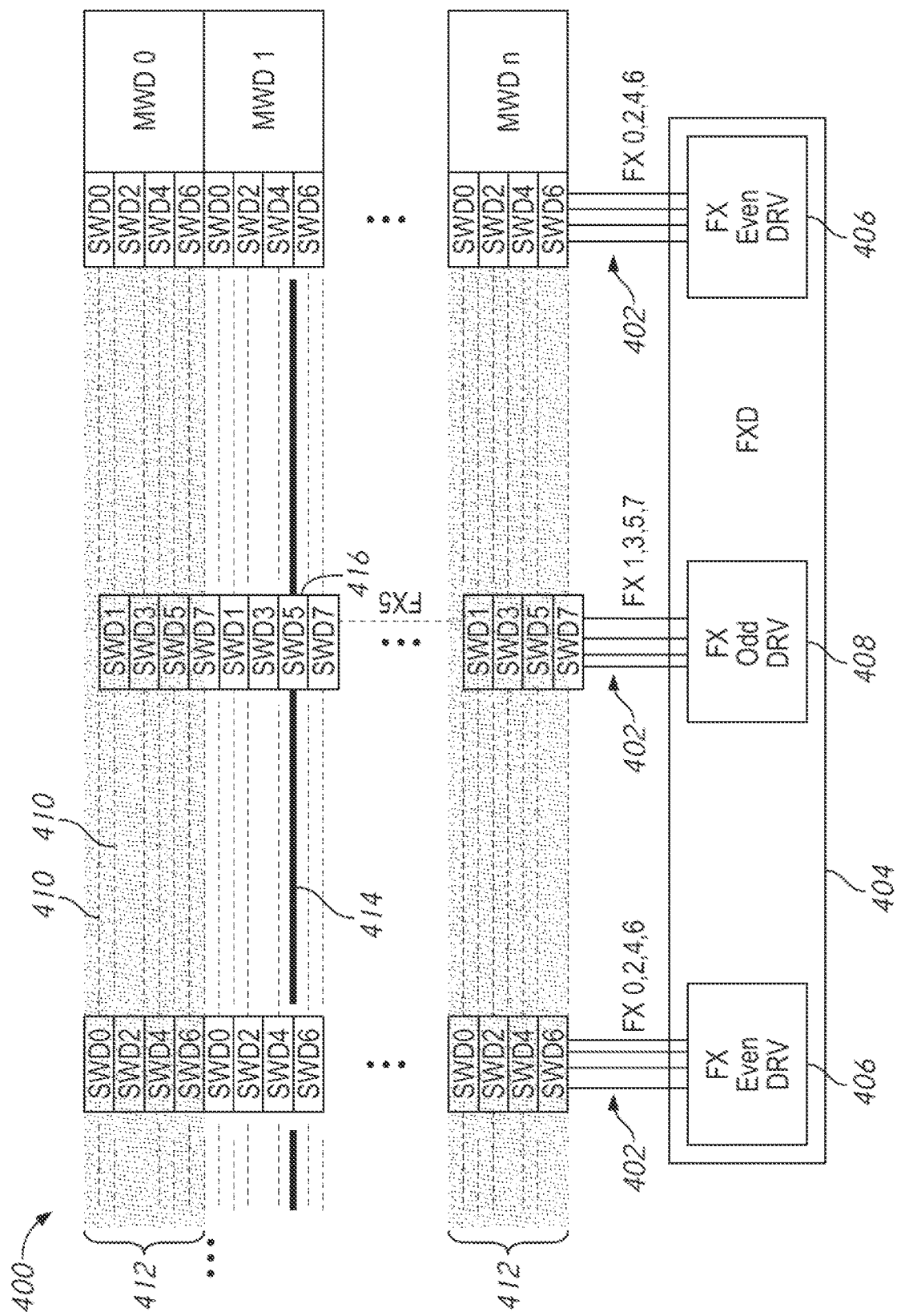
FIG. 4 is a schematic diagram of a portion of a bank of a memory cell array according to an embodiment of the disclosure.

FIG. 4 is a schematic diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and/or the memory cell array 11 of FIG. 1.

The subword lines are adjacent to each other, and driven by subword drivers SWD0-7 of different subword driver groups. Corresponding main word signals (not shown), driving signals FX, and low voltage VSS (not shown) are provided to the subword drivers SWD0-7. In some embodiments, other voltages may be provided, such as a negative voltage VNRD and/or low voltage VOFF. In some embodiments, the main word signals and the driving signals FX are signals that may be provided by main word drivers MWD0-N and word drivers FXD 404, respectively, included with the row decoder circuit, such as row decoder circuit 12 shown in FIG. 1, based upon the row address RA. The main word signal is provided to the subword drivers SWD0-7 over a main word line (not shown in FIG. 4), and the driving signals FX are provided to the subword drivers SWD0-7 over word driver lines 402.

A main word line MWL may extend over array regions of a respective memory mat (e.g., a memory mat in SUB- MAT1-0 in FIG. 3) to provide the main word signal to the subword driver groups of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0. SWD2, SWD4, and SWD6, of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FXL 5 may be coupled to the subword driver SWD5 of each memory mat.

In the example memory operation shown in FIG. 4, a row address RA has indicated MWD1 to be activated (e.g., selected) and odd word driver 408 associated with word driver line FXL 5 to be activated (e.g., selected). As a result, a main word line MWL (not shown in FIG. 4) associated with MWD1 and driving signals (e.g., FXT and FXF) on the word driver line FXL 5 may be driven to active states for at least a portion of the duration of the memory operation (e.g., active period) to activate subword driver SWD5 416.

As shown by the shaded regions 412, subword lines 410 associated with the main word drivers MWD0, MWDn remain inactive, even the subword lines associated with word driver line FXL 5. However, the subword line 414 driven by subword driver SWD5 416 associated with activated MWD1 and FXL 5 is activated to allow access to memory cells along subword line 414. Thus, a selected subword line SWL of the selected memory mat associated with MWD1 is driven to the high voltage by the corresponding activated subword driver SWD5. In some examples, the other subword drivers SWD of the selected memory mat drive the respective unselected subword lines SWL to the low voltage to remain inactive. Subword drivers SWD of unselected memory mats (e.g., memory mats associated with MWD0 and MWDn) remain deactivated, and the subword lines SWL of the unselected memory mats MAT are not provided a voltage in some examples. That is, while a subword driver SWD may be enabled by an active main word driver MWD or an active word driver FXD, in order to be activated, a subword line SWL must be associated with a subword driver SWD coupled to an activated word driver FXD and an activated main word driver MWD. After the memory cells of the selected subword line SWL have been accessed, the selected subword line SWL is then discharged to the low voltage by deactivating the MWD and/or FXD as described herein.

Figure 5:
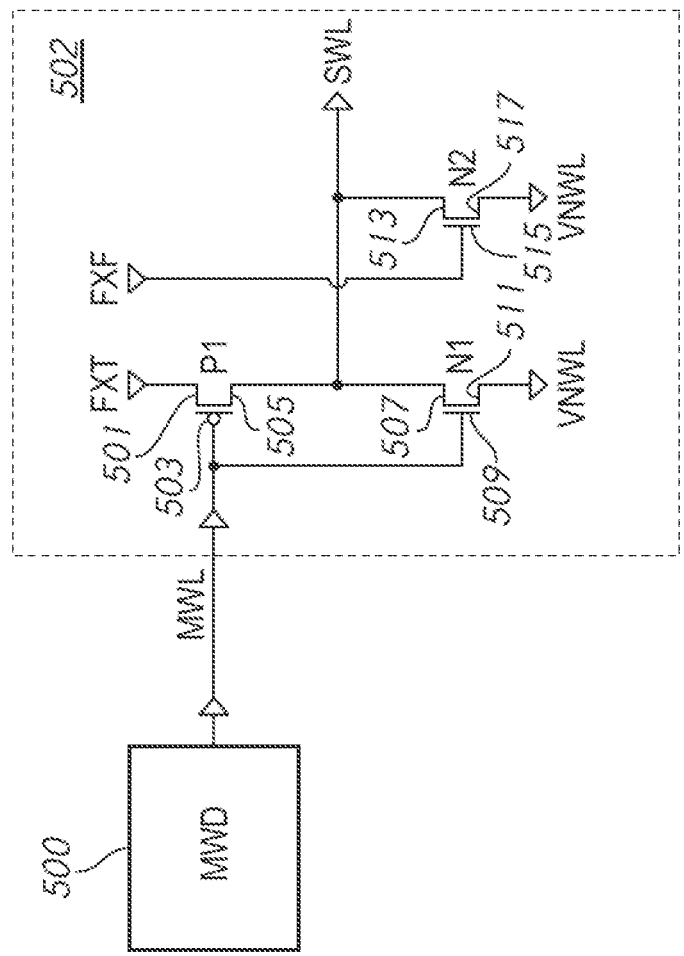
FIG. 5 is a block diagram of a main word driver and subword line driver according to an embodiment of the disclosure.

FIG. 5 is a diagram of a main word driver MWD 500 and a subword driver SWD 502 according to an embodiment of the disclosure. The main word driver MWD 500 may be included in the main word drivers in FIG. 1, FIG. 1 and/or FIG. 4 in some embodiments. The subword driver SWD 502 may be included in subword drivers in FIGS. 1 and 4 in some embodiments.

In the embodiment shown in FIG. 5, the subword driver SWD 502 includes a P-channel type field effect transistor P1 and N-channel type field effect transistors N1 and N2. The transistors P1 and N1 are series-coupled to each other at nodes 505 and 507, respectively, and a main word line MWL is provided to the gate electrodes 503 and 509, respectively. A driving signal FXT is provided to the node 501 (e.g., drain or source) of the transistor P1, and a low voltage is provided to the node 511 (e.g., drain or source) of the transistor N1. While the inactive voltage is VNWL in FIG. 5, other voltages may also be used (e.g., ground, negative voltage). The nodes (e.g., drains or sources) of the transistors P1 and N1 are coupled to subword line SWL. A driving signal FXF is provided to the gate 515 of the transistor N2, with its node 513 (e.g., drain or source) being coupled to the subword line SWL, and the low voltage is provided to the node 517 (e.g., drain or source). As previously described, the main word line MWL is provided by main word driver MWD 500 and the driving signals FXT and FXF are provided by a word driver (not shown in FIG. 5) on word driver lines FXL.

The main word line MWL provides a low level when selected, and the driving signals FXT and FXF are signals that respectively become a high level and a low level when selected. The driving signals FXT and FXF are complementary signals. When the main word line MWL and the driving signals FXT and FXF are activated (e.g., MWL and FXF are low and FXT is high), transistors N1 and N2 are not activated, but the transistor P1 is activated to provide the FXT signal to activate the corresponding subword line SWL. In contrast, when the main word line MWL is in the inactive state, and either of the driving signals FXT and FXF is also in the inactive state, the corresponding subword line SWL is inactive. The voltage to which the subword line SWL is driven for active and inactive states may be based, at least in part, on a voltage of the FXT and/or FXF signals and/or MWL. For example, when FXT is driven to VCCP and FXF is driven to VSS, subword line SWL may be driven to VCCP when activated by MWL.

In some embodiments, MWL may be driven to the two different active low voltages. For example, the MWD 500 may drive the MWL to an active low voltage of a reference voltage (e.g., VSS) or an active low negative voltage. Driving MWL to a lower voltage (e.g., a negative voltage) for at least a period of time while MWL is active may control the discharge of the SWL. For example, driving MWL to a negative voltage (e.g., −0.5V, −1.0V), may increase the conductivity of P1 of the subword driver SWD 502 compared to when the MWL is driven to a low voltage (e.g., 0.0V, 0.5V) in some embodiments, and as a result, increase a rate of discharge of the SWL. In some embodiments, the MWL may be driven to a first active low voltage (e.g., VSS) during a memory activation sequence (e.g., responsive to an activation command ACT). Responsive to a precharge command (e.g., PRE), MWL may be driven to a second active low voltage, which may be lower than the first active low voltage. In some embodiments, the second low voltage may be a negative voltage. At a completion of a precharge sequence, MWL may be returned to a high voltage (e.g., an inactive state). In other embodiments, the MWL may be driven to the negative voltage for the entire time the MWD 500 is active.

Figure 6:
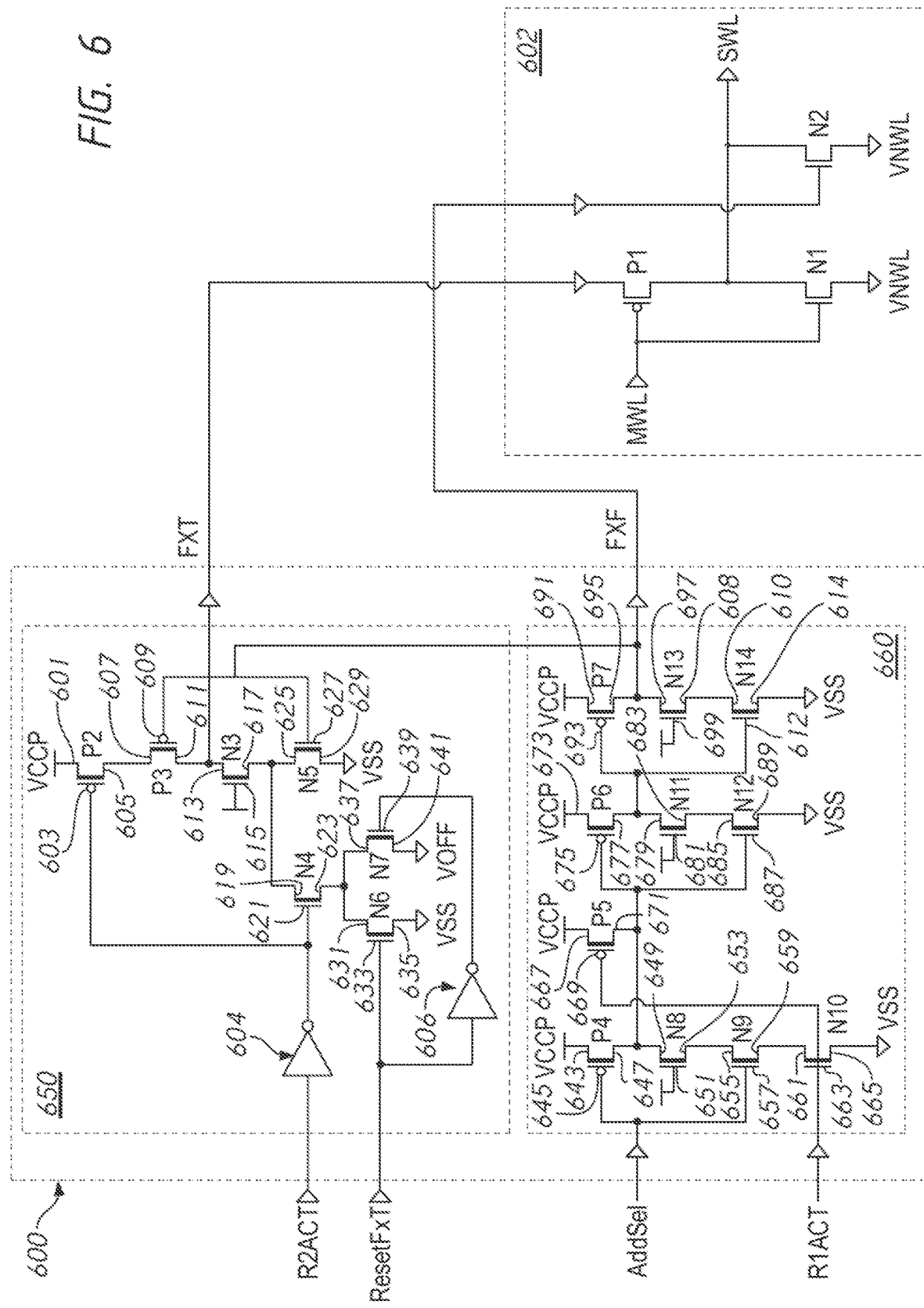
FIG. 6 is a circuit diagram of a word driver according to an embodiment of the disclosure.

FIG. 6 is a circuit diagram of a word driver FXD 600 according to an embodiment of the disclosure. The word driver FXD 600 may be included in the word drivers in FIG. 1, FIG. 1 and/or FIG. 4 in some embodiments. For context, a subword driver SWD 602 is also shown. The subword driver SWD 602 may be included in subword drivers in FIGS. 1 and 4 in some embodiments. In some embodiments, MWL coupled to the subword driver SWD 602 may be provided by a main word driver MWD, such as MWD shown in FIG. 1, MWD shown in FIG. 3, or MWD shown in FIG. 4, or MWD 500 shown FIG. 5. The subword driver SWD 602 may be substantially the same as the subword driver SWD 502 in some embodiments. Accordingly, for brevity, a detailed discussion of the structure and operation of the subword driver SWD 602 is omitted.

The word driver FXD 600 may receive one or more signals in some embodiments. In the example shown in FIG. 6, the word driver FXD 600 receives control signal R2ACT, control signal R1ACT, driving signal reset control signal ResetFxT, and address select signal AddSel. In some embodiments, the signals may be provided by address decoder logic and/or a word driver control circuit of a row decoder circuit, such as row decoder circuit 12 shown in FIG. 1.

The word driver FXD 600 may include an FXT driver 650 and an FXF driver 660 (e.g., first and second driving signal drivers) in some embodiments. The FXT driver 650 may receive the R2ACT, ResetFxT, and driving signal FXF and provide the driving signal FXT. The FXF driver 660 may receive the AddSel signal and the R1ACT signals and provide the driving signal FXF.

FXT driver 650 may include a P-channel transistor P2 coupled to a high voltage (e.g., VCCP) at a node 601. A second P-channel transistor P3 may be coupled at node 607 to node 605 of P2. Node 611 of transistor P3 may be coupled to node 613 of N-channel transistor N3. Word driving signal FXT may be provided between nodes 611 and 613. Node 617 of N3 may be coupled to node 619 of N-channel transistor N4 and node 625 of N-channel transistor N5. Node 629 of N5 may be coupled to a low voltage (e.g., VSS). Node 623 of N4 may be coupled to node 631 of N-channel transistor N6 and node 637 of N-channel transistor N7. Node 635 of N6 may be coupled to a low voltage (e.g., VSS). Node 641 of N7 may be coupled to a low voltage (e.g., VOFF). In some embodiments, N7 may be coupled to a higher voltage than N6 (e.g., VOFF may be greater than VSS). An inverter 604 may receive signal R2ACT and provide an inverted R2ACT signal to gate 603 of P2 and gate 621 of N4. Gate 633 of N6 may receive ResetFxT. Gate 639 of N7 may receive an inverted ResetFxT signal from inverter 606. Gate 609 of P3 and gate 627 of N5 may receive word driving signal FXF from FXF driver 660. Gate 615 of N3 may be coupled to a voltage sufficient to activate N3 (e.g., VCCP. In some embodiments, the low voltage VSS may be the same as the inactive voltage VNWL of the subword driver SWD 602.

FXF driver 660 may include a P-channel transistor P4 coupled to a high voltage (e.g., VCCP) at node 643. Transistor P4 may be coupled in series with N-channel transistors N8, N9, and N10. Node 665 of transistor N10 may be coupled to a low voltage (e.g., VSS). A P-channel transistor P5 may be coupled to a high voltage (e.g., VCCP) at node 667 and to node 647 of P4 and node 649 of N8. FXF driver 660 may include P-channel transistor P6 coupled to a high voltage at node 673. Transistor P6 may be coupled in series with N-channel transistors N11 and N12. Node 689 of N12 may be coupled to a low voltage (e.g., VSS). FXF driver 660 may include P-channel transistor P7 coupled to a high voltage (e.g., VCCP) at node 691. Transistor P7 may be coupled in series with N-channel transistors N13 and N14. The node 614 of N14 may be coupled to a low voltage (e.g., VSS). Word driving signal FXF may be provided between node 695 of P7 and node 697 of N13. Gate 645 of P4 and gate 657 of N9 may receive signal AddSel. Gate 651 of N8 may receive a voltage sufficient to activate N8 (e.g., VCCP). Gate 663 of N10 and gate 669 of P5 may receive control signal R1ACT. Gate 675 of P6 and gate 687 of N12 may be coupled to node 671 of P5, node 647 of P4, and node 649 of N8. Gate 681 of N11 may be coupled to a voltage sufficient to activate N11 (e.g., VCCP). Gate 693 of P7 and gate 612 of N14 may be coupled to node 677 of P6 and node 679 of N11. Gate 699 of N13 may be coupled to a voltage sufficient to activate N13 (e.g., VCCP).

As shown in FIG. 6, transistors P4 and N9, transistors P5 and N10, transistors P6 and N12, and transistors P7 and N14 may act as inverters in some embodiments. Transistors P4 and N9 may provide an inverted AddSel and transistors P5 and N10 may provide an inverted R1ACT. However, transistors P5 and N10 may only be effective when AddSel is active. Transistors P6 and N12 may provide and signal received from the nodes of P4 and P5 and transistors P7 and N14 may provide an inverted signal received from the node 695 of P7 as FXF. Thus, in other embodiments, the FXF driver 660 may include different transistors and/or logic circuitry that provides the equivalent functions of the inverters.

In some embodiments, transistors N3, N8. N11, and/or N13 may be included for maintaining voltage and/or current in the word driver FXD 600. In some embodiments, transistors N3. N8, N11, and/or N13 may be omitted.

The word driver FXD 600 may activate and deactivate word driving signals FXT and FXF based, at least in part, on the signals R2ACT, ResetFxT, AddSel, and R1ACT. The activating and deactivating of the word driving signals may enable/disable and/or activate/deactivate the subword line SWL. In some embodiments, the discharge of the subword line SWL may be controlled, at least in part, by the activating and deactivating of the word driving signals FXT and FXF. A more detailed explanation of the operation of the word driver FXD 600 will be provided with reference to timing diagrams 800 in FIG. 8.

Figure 7B:
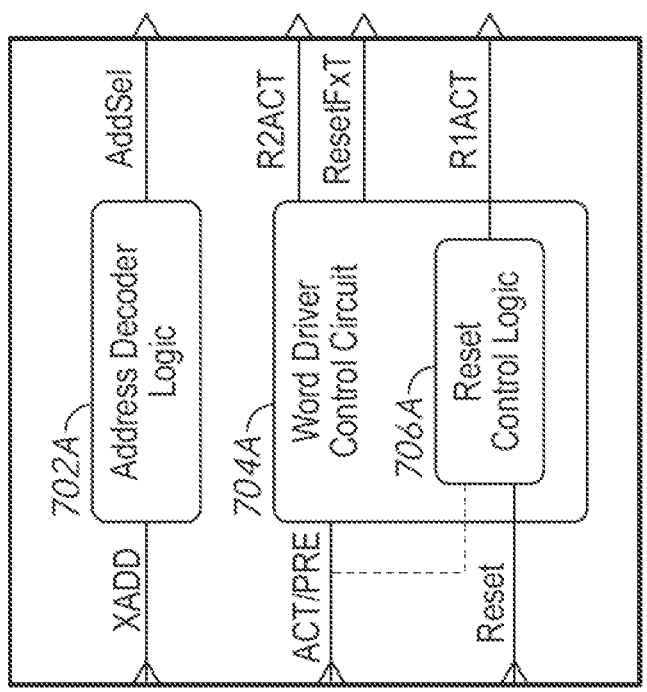
FIGS. 7A and 7B are block diagrams of row decoder circuits according to embodiments of the disclosure.
Figure 7A:
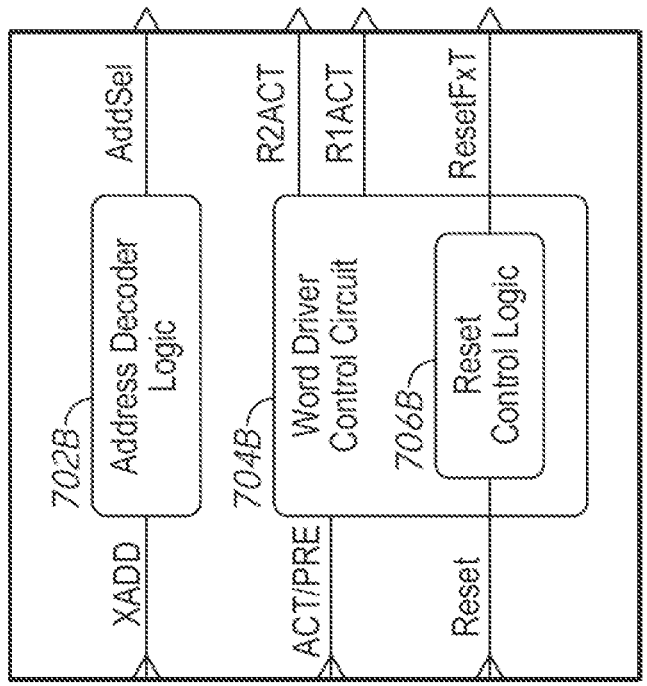

FIGS. 7A and 7B are block diagrams of address decoder logic 702A and 702B and word driver control circuits 704A and 704B, respectively according to embodiments of the disclosure. The address decoder logic and/or word driver control circuits shown in FIGS. 7A and 7B may be included in the row decoder circuit 12 in FIG. 1 in some embodiments. In some embodiments, the address decoder logic and/or word driver control circuits shown in FIGS. 7A and 7B may provide one or more signals to a word driver, for example, the word drivers FXD in FIGS. 1, 3, 4, and the word driver FXD 600 in FIG. 6.

Focusing on FIG. 7A, the word driver control circuit 704A may include reset control logic 706A. The address decoder logic 702A may receive an address (e.g., XADD) and provide address select signal AddSel. In some embodiments, the address may be provided by an address decoder circuit, such as address decoder circuit 32 shown in FIG. 1. The address decoder logic 702A may provide an active AddSel signal to a word driver associated with the received address.

The word driver control circuit 704A may receive activation signal ACT or precharge signal PRE and reset signal Reset. The word driver control circuit 704A may provide control signals R2ACT, ResetFxT, and R1ACT. In some embodiments. ACT/PRE and Reset may be provided by a command decoder circuit, such as command decoder circuit 34 shown in FIG. 1. In some embodiments, the word driver control circuit 704A may activate or deactivate R2ACT and ResetFxT based, at least in part, on receiving an active activation signal ACT or precharge signal PRE.

In some embodiments, the reset signal Reset may be received by reset control logic 706A. The reset control logic 706A may transition a state of the R1ACT based, at least in part, on the reset signal Reset. In some embodiments, the state of R1ACT may be based, at least in part, on both the ACT/PRE and the reset signal Reset.

Turning to FIG. 7B, the word driver control circuit 704B may include reset control logic 706B. The address decoder logic 702B may receive an address (e.g., XADD) and provide address select signal AddSel. In some embodiments, the address may be provided by an address decoder circuit, such as address decoder circuit 32 shown in FIG. 1. The address deco der logic 702B may provide an active AddSel signal to a word driver associated with the received address.

The word driver control circuit 704B may receive activation signal ACT or precharge signal PRE and reset signal Reset and provide control signals R2ACT, ResetFxT, and R1ACT. In some embodiments. ACT/PRE and Reset may be provided by a command decoder circuit, such as command decoder circuit 34 shown in FIG. 1. In some embodiments, the word driver control circuit 704B may activate or deactivate R2ACT and R1ACT bawd, at least in part, on receiving an active activation signal ACT or precharge signal PRE. In some embodiments, the reset signal Reset may be received by reset control logic 706B. The reset control logic 706B may transition a state of the ResetFxT based, at least in part, on the reset signal Reset.

In some embodiments, the word driver control circuits 704A and 704B may be combined into a single row decoder. Additional logic (not shown) may be provided to select a mode of operation of the row decoder. In some embodiments, a memory device may include both word driver control circuits 704A and 704B and a selection signal (not shown) may be provided to select the word driver control circuit used for a memory operation. Other combinations of word driver control circuits 704A and 704B may also be used to provide the functionality of both row decoder circuits.

Figure 8:
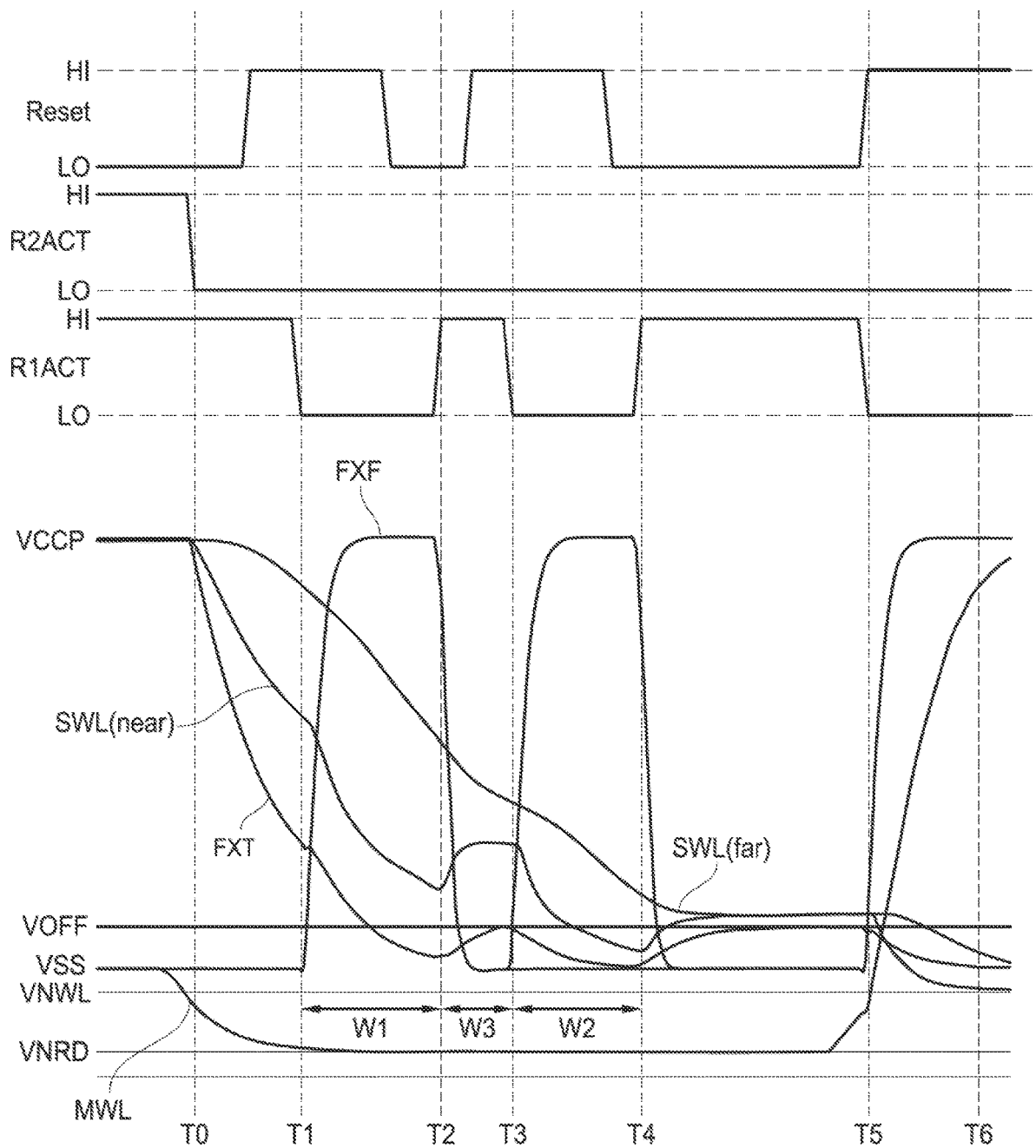
FIG. 8 is a timing diagram of various signals during operation of a driver circuit according to an embodiment of the disclosure.

FIG. 8 is a timing diagram 800 of various signals during an operation of a driver circuit and word driver control circuit according to an embodiment of the disclosure. In some embodiments, the timing diagram 800 may show the operation of a driver circuit and a FX driver control circuit during a memory access operation (e.g., resetting of a subword line SWL). In some embodiments of the disclosure, the driver circuit of FIG. 6 and the word driver control circuit 704A are operated according to the example operation of the timing diagram 800. The timing diagram 800 will be described with reference to the driver circuit of FIG. 6 and the word driver control circuit 704A shown in FIG. 7A. However, the example of FIG. 8 is not limited to the specific embodiment of the word driver FXD 600 and word driver control circuit 704A.

Timing diagram 800 shows the states of driving signals FXT, FXF, main word line MWL, and subword lines SWLs, and further shows the states of control signals Reset. R2ACT, and R1ACT. Voltages at different locations along a SWL are shown in the timing diagram 800, namely, a voltage relatively near a subword driver SWD that drives the SWL and a voltage relatively far from the subword driver SWD. The main word line MWL may be provided by a main word driver MWD, such as the main word driver MWD shown in FIGS. 1, 3, 4, and/or the main word driver MWD 500 shown in FIG. 5. While the state of the main word line MWL is shown for context in the timing diagram 800, the specific operation of the main word line MWL shown in the timing diagram 800 is not required for operation of the driver circuit, such as the word driver FXD 600 shown in FIG. 6 or the word driver control circuit 704A shown in FIG.

7A. In some embodiments, the control signals R2ACT, R1ACT are provided by a word driver control circuit, such as the word driver control circuit 704A shown in FIG. 7k In some embodiments, the reset signal Reset is received by the word driver control circuit.

At some time before T0, the word driver control circuit 704A drives the control signal R2ACT from an active state at a high voltage to an inactive state at a low voltage, responsive to a precharge signal PRE in an active state. The control signal R2ACT in an inactive state activates the transistor N4 and deactivates the transistor P2 in the FXT driver 650. As a result, at about time T0 the driving signal FXT is driven from an active state at a high voltage VCCP to an inactive state at a lower voltage through the transistor N4 in the FXT driver 650 at or around T0. Depending, for example, on the state of the driving signal reset control signal ResetFxT, the driving signal FXT may be driven to an inactive state at a first low voltage VSS or a second low voltage VOFF.

At some time before T0, the word driver control circuit 704A also provides the control signal R1ACT at an active state at a high voltage, for example, from a previous access operation. When the control signal R1ACT is in an active state, the transistors N10, P6, and N14 are activated and the FXF driver 660 provides a driving signal FXF in an active state (e.g., active low signal). Responsive to a reset signal Reset in an active state, the word driver control circuit 704A may transition the control signal R1ACT to an inactive state at a low voltage. In some embodiments, the reset signal Reset transitions responsive to an active precharge signal PRE. In some embodiments, the reset signal Reset transitions independently of the precharge signal PRE. The control signal R1ACT in an inactive state deactivates the transistors N10, P6, and N14 and activates the transistors P5. N12, and P7 in the FXF driver 660. As a result, the driving signal FXF is driven from an active state at a first low voltage VSS to an inactive state at a high voltage VCCP at or around T1. This temporary deactivation of the driving signal FXF may be referred to as a "FXF reset pulse," or simply as a "reset pulse." By "temporary" or "temporarily," it is meant that a signal does not remain in a state for a duration, or remaining duration, of when the signal is typically in an active or inactive period of the signal during a memory operation. The driving signal FXF in an inactive state deactivates the transistor P3 and activates the transistor N5 in the FXT driver 650. This causes the driving signal FXT to be driven toward the first low voltage VSS as it is disconnected from the high voltage VCCP at the transistor P2 and connected to a path to a low voltage by the transistor N5, in addition to the path to a low voltage through the activated transistor N4 and transistor N6 or N7.

As the driving signal FXF is driven to the inactive state at the high voltage VCCP, the transistor N2 in the subword driver SWD 602 is activated, which couples the driving signal FXT, via the transistor P1, and the subword lines SWLs to an inactive voltage (e.g., VNWL). Thus, the driving signal FXT continues to discharge and the subword lines SWLs begin to discharge toward the inactive voltage (e.g., VNWL) through the transistor N2 at or around T1.

The reset signal Reset returns to an inactive state (e.g., a low potential in the example shown in FIG. 8). In response to the inactive Reset signal, the word driver control circuit 704A drives the control signal R1ACT back to the active state at a high voltage. This again activates the transistors N10, P6, and N14 and deactivates the transistors P5, N12, and P7 to drive the driving signal FXF back towards the active state at the first low voltage VSS at or around T2. The control signal FXF in an active state deactivates the transistors N2 and N5 and reactivates the transistor P3. This allows the driving signal FXT to be driven back up towards the second low voltage VOFF through the FXT driver 650 at or around T2. Because the transistor N2 is deactivated, the subword lines SWLs are driven towards the same voltage as the driving signal FXT at or around T2.

At some time before T3, the word driver control circuit 704A again drives the control signal R1ACT from the active state at a high voltage to the inactive state at a low voltage. In some embodiments, the word driver control circuit 704A drives the control signal R1ACT to the inactive state responsive to the reset signal Reset in an active state. As with the transition of the driving signal FXF at time T1 to an inactive state as previously described, the driving signal FXF is again driven from the active state at the first low voltage VSS to the inactive state at the high voltage VCCP at or around T3. The inactive state driving signal FXF again activates the transistor N2. While the driving signal FXF is driven to the inactive state, the driving signal FXT is discharged to the low voltage VSS through the transistor N5 and the subword lines SWLs continue to discharge toward the inactive voltage (e.g., VNWL) through the transistor N2 at or around T3.

At some time before T4, the word driver control circuit 704A drives the control signal R1ACT back to the active state at a high voltage (e.g., responsive to a reset signal Reset). As a result, again the transistors N10, P6, and N14 are activated and the transistors P5, N12, and P7 are deactivated by the active state control signal R1ACT. As previously described, the driving signal FXF is driven back to the active state at the first low voltage VSS through activated transistor N14. The active state driving signal FXF deactivates the transistor N5, and the driving signal FXT is driven back up towards the second low voltage VOFF through the FXT driver 650 at or around T4. Additionally, as also previously described, the transistor N2 is deactivated by the active state driving signal FXF and the subword lines SWLs are driven towards a same voltage as the driving signal FXT at or around T4.

At some time before T5, the word driver control circuit 704A drives the control signal R1ACT from the active state at a high voltage to the inactive state at a low voltage. This may be responsive to a precharge command, timing logic, and/or other signals. This causes the driving signal FXF to be driven from the active state at the first low voltage VSS to the inactive state at the high voltage VCCP at or around T5. The inactive state driving signal FXF activates the transistor N2 again to further discharge the subword lines SWLs toward the inactive voltage (e.g., VNWL) through the transistor N2 at or around T5, in some embodiments, the driving signal reset control signal ResetFxT transitions to a high voltage and activates the transistor N6 and deactivates the transistor N7, which causes the driving signal FXT to be driven to the first low voltage VSS at T5.

Also at some time before T5, the main word line MWL begins transitioning from an active state at a negative voltage VNRD towards an inactive state at a high voltage VCCP. The inactive state driving signal FXF activates the transistor N2 and the inactive state main word line MWL deactivates the transistor P1 and activates the transistor N1, which drive the subword lines SWLs to the inactive voltage (e.g., VNWL) at or around T6 (e.g., from VOFF of FXT to VNWL).

Although the main word line MWL is shown being driven from the first low voltage VSS to the negative voltage VNRD at some time before T0, the main word line MWL need not be driven to the negative voltage VNRD for control of the discharge of the subword lines SWLs by the driving signals FXF and FXT. That is, the main word line MWL can remain at a single low voltage (e.g., a first low voltage VSS, a second low voltage VOFF) for the entire time it is activated in some embodiments. However, driving the main word line MWL to the negative voltage VNRD as shown in the timing diagram 800 may provide additional control over the discharge of the subword lines SWLs. That is, the discharge of the subword lines SWLs may be controlled by both a main word driver MWD and a word driver FXD during a memory operation.

As previously described, the subword lines SWLs are discharged through the transistor N2 when activated by an inactive driving signal FXF, for example, during FXF reset pulses and a transition of the driving signal FXF to an inactive state following the FXF reset pulses. As a result, the discharge of the subword lines SWLs are controlled, occurring in multiple steps. In the embodiment shown in FIG. 8, the discharge of the subword lines SWLs are controlled over three steps. First and second steps correspond to the FXF reset pulses, for example, at T1 and T3. The FXF reset pulses may be controlled such that a subword line SWL does not reach the inactive voltage (e.g., VNWL) while the FXF reset pulse(s) is applied (e.g., a time duration of a FXF reset pulse W1 and/or W2, a time interval of adjacent FXF reset pulses W3). A third step corresponds to a transition of the driving signal FXF to an inactive state following the FXF reset pulses at T6, which discharges the subword line SWL to the inactive voltage (e.g., VNWL).

The embodiment of FIG. 8 illustrates an example including two FXF reset pulses and a transition of the driving signal FXF to an inactive state following the FXF reset pulses to provide a controlled multiple step discharge of the subword line SWL. In some embodiments, more than two FXF pulses may be included. Also, in some embodiments, two or more of FXF pulses may be the same time duration, while in some embodiments, two or more of the FXF pulses may have different time durations.

The apparatuses and methods described herein may control the discharge of a subword line. For example, the rate of discharge and/or the voltage to which the subword line discharges may be controlled. As described herein, in some embodiments, the discharge of the subword line may be controlled by driving a main word line MWL to a first low voltage and subsequently to a second low voltage, less than the first voltage. The second low voltage may be a negative voltage. In some embodiments, the MWL may be driven to a single low voltage having a negative voltage. In some embodiments, the discharge of the subword line may be controlled by resetting a first word driver line signal and/or a second word driver line signal one or more times. In some embodiments, the discharge of the subword line may be controlled by a combination of driving a main word line MWL and resetting a first word driver line signal and/or a second word driver line signal. In some applications, controlling the discharge of the subword line as described herein may reduce the effects of a repeated access to a subword line, while increasing discharging rates of the subword lines and equalizing discharging rates of subword lines.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a subword driver configured to drive a subword line, wherein the subword driver includes a transistor coupled to the subword line;
a word driver control circuit configured to provide a first control signal and a second control signal; and
a word driver configured to receive the first and second control signals, and based on the first control signal provide a driving signal including a plurality of reset pulses to the transistor of the subword driver to activate the transistor a corresponding plurality of times to discharge the subword line, and further provide the driving signal including a transition following the plurality of reset pulses to activate the transistor to further discharge the subword line.

2. The apparatus of claim 1, wherein the subword driver further includes a second transistor coupled to the subword line and wherein the word driver is further configured to provide a second driving signal to the second transistor having a voltage to begin discharging the subword line before a first reset pulse of the plurality of reset pulses of the driving signal, the second driving signal provided based on the second control signal.

3. The apparatus of claim 2, wherein the word driver comprises:
a first driving signal driver configured to provide the driving signal based on the first control signal; and
a second driving signal driver configured to provide the second driving signal based on the second control signal, the second driving signal driver further configured to receive the driving signal and change a voltage of the second driving signal based on the driving signal.

4. The apparatus of claim 2, wherein the subword driver further includes a third transistor coupled to the subword line and configured to be activated when the second transistor is deactivated, the third transistor further configured to discharge the subword line to an inactive voltage when activated.

5. The apparatus of claim 4, wherein the inactive voltage of the subword line is a negative voltage.

6. The apparatus of claim 4, wherein the word driver is configured to provide the driving signal including the plurality of reset pulses to the transistor of the subword driver to activate the transistor a corresponding plurality of times to discharge the subword line to a voltage greater than the inactive voltage.

7. The apparatus of claim 2, wherein the subword driver is configured to discharge the subword line to the voltage of the second driving signal based on the plurality of reset pulses of the driving signal.

8. A method, comprising:
activating and deactivating a first transistor coupled to a subword line a plurality of times to discharge a voltage of the subword line responsive, at least in part, to a first control signal and a second control signal provided by a word driver control circuit;
activating the first transistor coupled to the subword line following the activating and deactivating of the first transistors a plurality of times to further discharge the voltage of the subword line;
activating a second transistor coupled to the subword line following the activating and deactivating of the first transistors a plurality of times to discharge the voltage of the subword line to an inactive voltage.

9. The method of claim 8, further comprising providing from a word driver a first driving signal including a plurality of reset pulses to the first transistor, wherein the activating and deactivating the first transistor a plurality of times is based on the plurality of reset pulses.

10. The method of claim 9, further comprising providing from the word driver a second driving signal to a third transistor coupled to the subword line, the second driving signal having a voltage to discharge the subword line before the plurality of reset pulses of the first driving signal.

11. The method of claim 10, further comprising providing from the word driver the second driving signal to the third transistor having a voltage following the plurality of reset pulses of the first driving signal on which a voltage of the discharged subword line is based.

12. The method of claim 11, wherein the inactive voltage is less than the voltage of the second driving signal following the plurality of reset pulsed of the driving signal.

13. The method of claim 10 wherein providing from the word driver the second driving signal comprises discharging at least in part the second driving signal based on the first driving signal.

14. A method, comprising:
driving a first driving signal from an active state at a high voltage to an inactive state at a low voltage and providing the first driving signal to a subword driver that is coupled to a subword line, at a first time;
driving a main word line coupled to the subword driver from an inactive state at the low voltage to an active state at a negative voltage, prior to the first time;
applying a first reset pulse to the subword driver to provide an inactive voltage to the subword line, the first reset pulse comprising a second driving signal in an inactive state at a high voltage for a first time duration, after the first time;
applying a second reset pulse to the subword driver to provide the inactive voltage to the subword line again, the second reset pulse comprising the second driving signal in the inactive state at the high voltage for a second time duration, after the first reset pulse, wherein the subword driver discharges the subword line when providing the inactive voltage to the subword line.

15. The method of claim 14, further comprising:
driving the second driving signal from the active state at the low voltage to the inactive state at the high voltage and providing the second driving signal to the subword driver, at a second time after the second reset pulse.

16. The method of claim 14, further comprising:
driving the main word line from the active state at the negative voltage to the inactive state at the low voltage, after the second reset pulse and prior to the second time.

17. The method of claim 14, wherein
the driving of the first driving signal at the first time comprises:
driving a first control signal from an active state at a high voltage to an inactive state at a low voltage, responsive to a precharge signal in an active state; and
driving the first driving signal from the active state at the high voltage to the inactive state at a low voltage, responsive to the first control signal in the inactive state.

18. The method of claim 14, wherein
the applying of the first reset pulse comprises:
driving a second control signal from an active state a low voltage to an inactive state at a high voltage, responsive to a reset signal in an active state;
driving the second driving signal from the active state at the low voltage to the inactive state at the high voltage, responsive to the second control signal in the inactive state;
driving the second control signal from the inactive state at the high voltage back to the active state at the low voltage, responsive to the reset signal in an inactive state; and
driving the second driving signal to the inactive state at the low voltage, responsive to the second control signal in the active state.

19. The method of claim 18, wherein
the applying of the second reset pulse comprises:
driving a second control signal from an active state a low voltage to an inactive state at a high voltage, responsive to a reset signal in an active state;
driving the second driving signal from the active state at the low voltage to the inactive state at the high voltage, responsive to the second control signal in the inactive state;
driving the second control signal from the inactive state at the high voltage back to the active state at the low voltage, responsive to the reset signal in an inactive state; and
driving the second driving signal to the inactive state at the low voltage, responsive to the second control signal in the active state.

* * * * *